United States Patent
Yang et al.

(10) Patent No.: US 9,900,145 B2
(45) Date of Patent: Feb. 20, 2018

(54) CLOCK GENERATOR AND METHOD FOR REDUCING ELECTROMAGNETIC INTERFERENCE FROM DIGITAL SYSTEMS

(71) Applicant: OmniVision Technologies, Inc., Santa Clara, CA (US)

(72) Inventors: Li Yang, Fremont, CA (US); Wengen Wang, Shanghai (CN); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/159,583

(22) Filed: May 19, 2016

(65) Prior Publication Data

US 2017/0338941 A1    Nov. 23, 2017

(51) Int. Cl.
  *H03D 3/24*    (2006.01)
  *H04L 7/033*   (2006.01)
  *H04L 5/00*    (2006.01)
  *H04B 1/69*    (2011.01)

(52) U.S. Cl.
  CPC ............ *H04L 7/0331* (2013.01); *H04B 1/69* (2013.01); *H04L 5/005* (2013.01)

(58) Field of Classification Search
  CPC ....... H04L 7/043; H04L 7/042; H04B 1/7085; H04B 1/707; H04B 1/7075
  USPC ................................................. 375/354–376
  See application file for complete search history.

(56) References Cited

U.S. PATENT DOCUMENTS

| | | | | |
|---|---|---|---|---|
| 5,917,850 A * | 6/1999 | Fujita | ............ | H04B 1/7075 327/141 |
| 6,687,319 B1 * | 2/2004 | Perino | ............ | H04B 1/707 375/130 |
| 6,954,856 B1 * | 10/2005 | Kohashi | ............ | G06T 1/005 380/201 |
| 6,982,403 B2 * | 1/2006 | Yang | ............ | H04N 5/361 250/208.1 |
| 7,346,095 B1 * | 3/2008 | Hattori | ............ | H04B 15/02 375/130 |
| 7,363,563 B1 * | 4/2008 | Hissen | ............ | H04L 1/243 327/144 |
| 7,715,514 B2 * | 5/2010 | Takeuchi | ............ | H03L 7/0814 327/160 |
| 7,885,353 B2 * | 2/2011 | Nakadaira | ............ | H04B 15/04 327/114 |
| 7,903,775 B2 * | 3/2011 | Ku | ............ | H04L 7/0012 375/220 |

(Continued)

*Primary Examiner* — James M Perez
(74) *Attorney, Agent, or Firm* — Lathrop Gage LLP

(57) ABSTRACT

A spread-spectrum clock generator has a phase-locked loop locked to a reference signal that gives a stable-frequency output to a variable phase shifter. The variable phase shifter provides a spread-spectrum clock output because its phase-shift is determined by a pseudorandom sequence generator and the pseudorandom sequence generator changes its output regularly or irregularly within limits. The clock generator performs a method of generating a spread-spectrum clock including locking the phase-locked loop to the reference signal, and phase shifting the stable frequency signal by a phase-shift determined by the pseudorandom sequence generator; and changing the phase-shift determined by the pseudorandom sequence generator. Since phase shifting is performed open-loop, total phase shift is defined by design.

15 Claims, 7 Drawing Sheets

(56) References Cited

U.S. PATENT DOCUMENTS

| | | | | |
|---|---|---|---|---|
| 8,106,690 | B2* | 1/2012 | Sakaguchi | H03L 7/0814 327/147 |
| 8,593,229 | B2* | 11/2013 | Chindo | G04F 5/145 331/176 |
| 2003/0177409 | A1* | 9/2003 | Greenstreet | G06F 9/3869 713/401 |
| 2004/0001533 | A1* | 1/2004 | Tran | G06F 1/10 375/141 |
| 2004/0032898 | A1* | 2/2004 | Smith | H03L 7/16 375/130 |
| 2004/0252751 | A1* | 12/2004 | Ogasawara | H03K 5/133 375/130 |
| 2005/0040893 | A1* | 2/2005 | Paist | H03L 7/1976 331/1 A |
| 2005/0105591 | A1* | 5/2005 | Egan | A63H 3/28 375/130 |
| 2006/0056562 | A1* | 3/2006 | Chen | G06F 1/04 375/376 |
| 2009/0086857 | A1* | 4/2009 | Wu | H03F 3/45708 375/345 |
| 2009/0212835 | A1* | 8/2009 | Xu | H03L 7/1974 327/156 |
| 2016/0234193 | A1* | 8/2016 | Chen | H04L 63/083 |

* cited by examiner

US 9,900,145 B2

CLOCK GENERATOR AND METHOD FOR REDUCING ELECTROMAGNETIC INTERFERENCE FROM DIGITAL SYSTEMS

BACKGROUND

It is well known that digital systems tend to generate radio frequency noise at harmonics of the clock frequencies of logic within the system, this is a result of switching transients throughout the system. In systems with fixed clock frequencies, this noise can be significant enough at particular frequencies to cause problems with other electronic devices, including radios and similar high-gain systems; in some systems this noise may result in sufficient electromagnetic radiation to cause issues with regulatory agencies.

A technique that has been used to reduce noise at particular peak frequencies is to modulate the clock frequency, "spreading" the clock frequency into a band. Spreading the clock frequency also spreads spectrum of the radiated harmonics from switching transients in the system, with result that intensity at nominal harmonic frequencies is reduced at the expense of increased noise at nearby frequencies. Clock generators that provide a frequency spreading function are referred to herein as spread-spectrum clock generators.

Some prior clock-frequency-spreading systems use a phase-locked loop to dither phase, and hence frequency, by shifting phase between the voltage-controlled oscillator (VCO) of the phase locked loop and the phase detector of the phase locked loop; U.S. Pat. No. 8,593,228 FIG. 8 discloses a system of this type. Accumulated phase shift at the phase detector causes a modulation on the VCO control voltage, modulating VCO output frequency periodically and slowly.

Some integrated circuits are mixed-signal integrated circuits that rely on sampling of analog signals at precise times, or on transitioning signals into analog circuitry at precise times. Clock jitter, such as would result if a VCO of a PLL clock generator driving an analog clock were to vary in frequency, could result in an undesirable noise-equivalent in sampled-data circuitry; for example clock jitter in a delta-sigma digital-to-analog converter (DAC) could cause noise on the DAC output. In typical mixed-signal integrated circuits, digital switching noise is a much stronger contributor to electromagnetic interference than is analog switching noise.

SUMMARY

In an embodiment, a spread-spectrum clock generator has a phase-locked loop locked to a reference signal that gives a stable-frequency output to a variable phase shifter. The variable phase shifter provides a spread-spectrum clock output because its phase-shift is determined by a pseudorandom sequence generator and the pseudorandom sequence generator changes its output within limits. In particular embodiments, frequency changes regularly, and in other embodiments frequency changes irregularly In another embodiment, the clock generator performs a method of generating a spread-spectrum clock including locking the phase-locked loop to the reference signal, and phase shifting the stable frequency signal by a phase-shift determined by the pseudorandom sequence generator, and changing the phase-shift determined by the pseudorandom sequence generator.

DETAILED DESCRIPTION OF THE EMBODIMENTS

Figure 1:
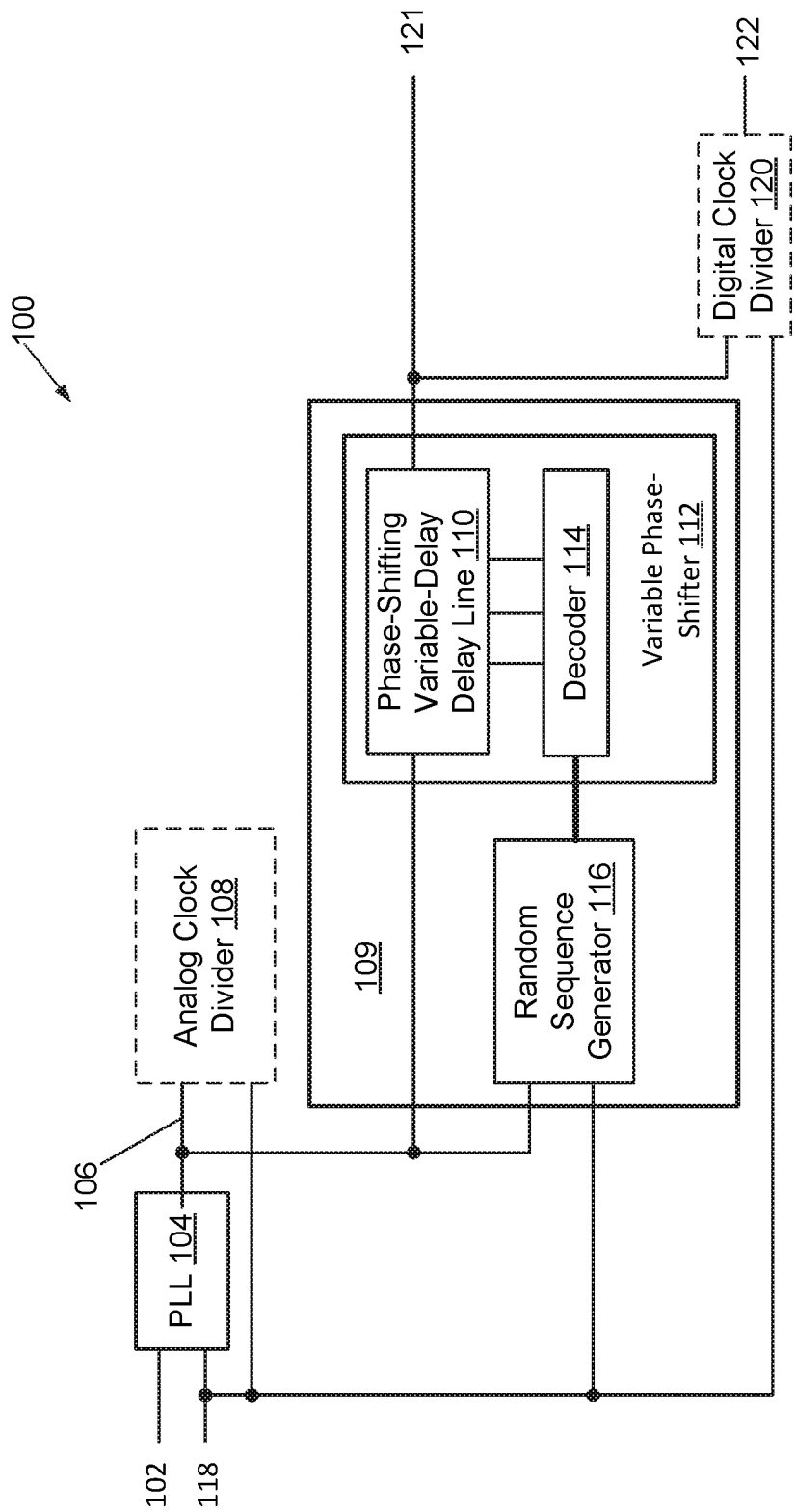
FIG. 1 is a block diagram of a clock generator providing frequency-spreading on digital clocks, while providing optional analog clocks at fixed frequency.

A clock generator 100 is illustrated in FIG. 1. The clock generator receives a reference signal 102, and a phase-locked loop, PLL 104, is configured to be locked to the reference signal. In typical embodiments, the phase-locked loop 104 has a reference divider, phase detector and filter, voltage-controlled oscillator, and feedback divider as known in the art of phase-locked loop clock generator circuits. In this system, phase-locked loop 104 is not dithered to spread noise frequencies, so phase-locked loop output 106 is referred to herein as a stable-frequency output even though it may track changes in the reference signal 102. Phase-locked loop output 106 drives an optional analog-clock divider 108. Phase-locked loop output 106 also drives a frequency-spreading system 109, within which it drives phase-shifting variable-delay delay line 110 of a variable phase-shifter 112, with a controlling decoder 114 controlled by a random sequence generator 116 adapted to vary phase-shifting variable-delay delay line 110. Phase-shifting variable-delay line 110 imposes a variable phase shift on its output 121, a phase shift that changes with delay of phase-shifting variable-delay delay line 110.

Output 121 from phase-shifting variable-delay delay line 110 may be buffered by a clock driver and used as digital clocks to portions of the system (including random sequence generator 116). In some embodiments, output 121 is divided by an optional digital clock divider 120 to produce multiple clock phases or lower frequency clocks 122 to drive other portions of the system.

Figure 2:
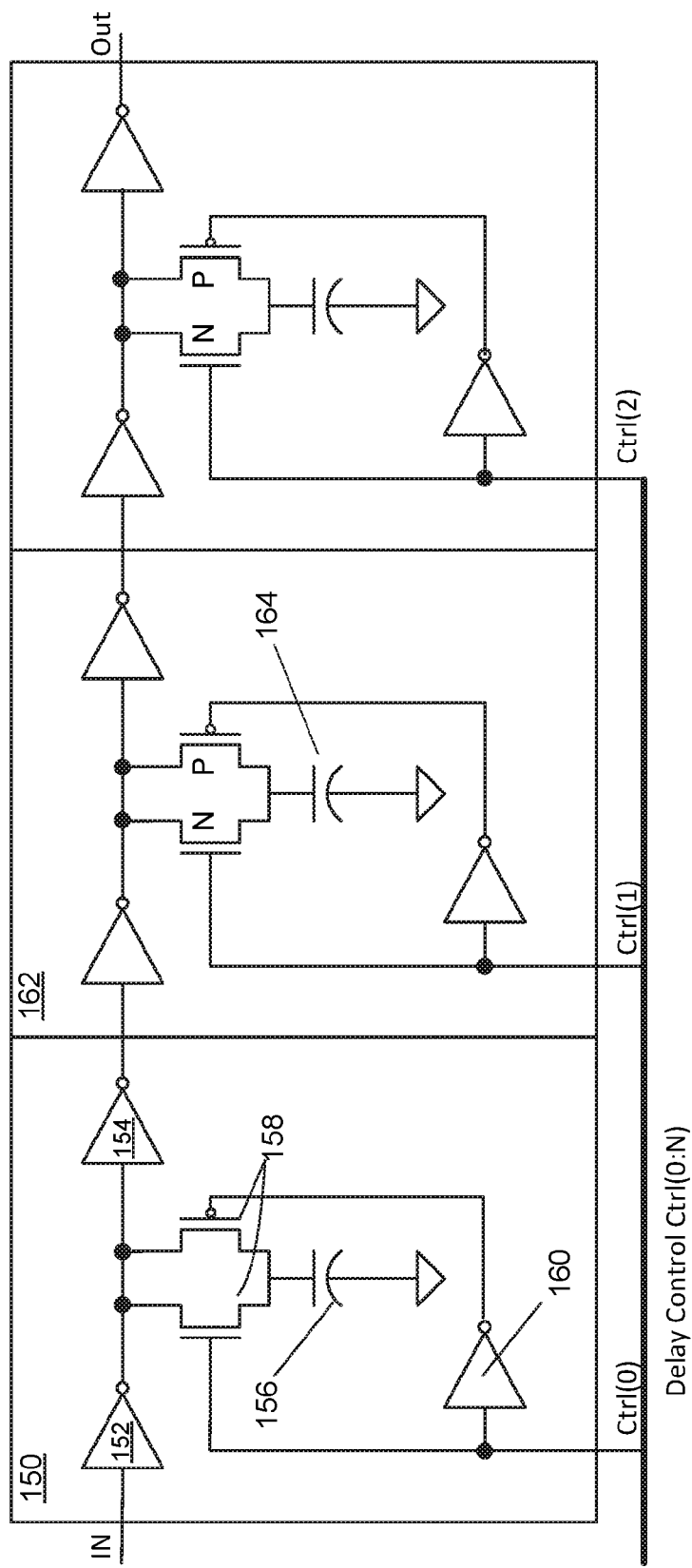
FIG. 2 illustrates an embodiment of an exemplary portion of phase-shifting variable-delay delay line 110 of FIG. 1.

An embodiment of phase-shifting variable-delay delay line 110, as shown in FIG. 2 may include stages 150, 162 each stage including one or more inverters 152, 154 with a capacitive load 156, the capacitive load switchable through a transmission gate 158 and associated logic 160 (FIG. 2). Each stage serves to provide an output that is delayed slightly from its input. In an embodiment each stage is non-inverting, and in an alternative embodiment each stage is inverting; delay from input to output of each stage is determined not by clock signals, but by analog factors such as the "R-C" circuit delay contributed by on-resistance of transistors and circuit capacitance. In order to better vary delay, and hence assist in scattering frequencies, the phase-shifting variable-delay delay line may have different switchable capacitive loads in each stage, hence capacitive load 156 of stage 150 may differ from load 164 of stage 162. The number of stages 150, 162 in phase-shifting variable-delay delay line 110 may vary without departing from the scope hereof.

Figure 3:
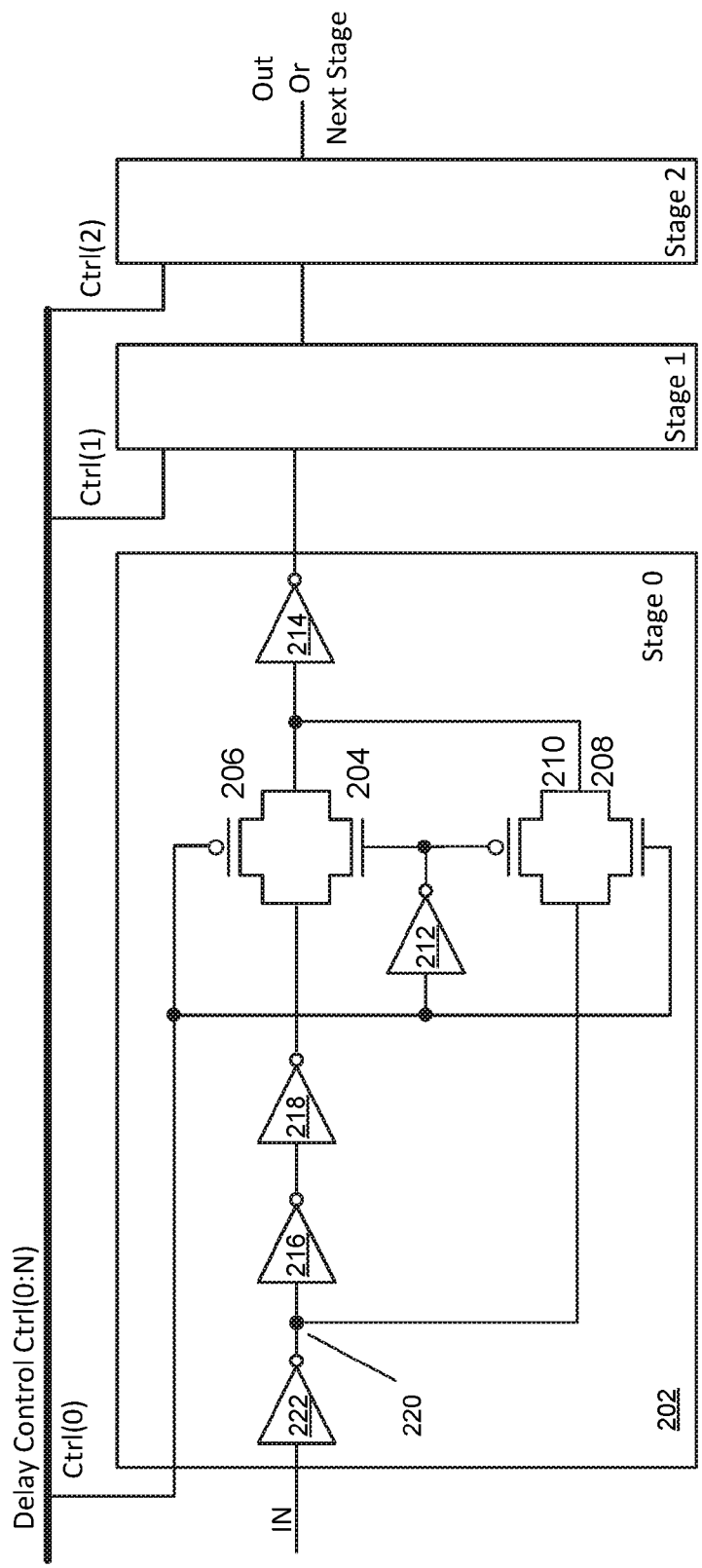
FIG. 3 illustrates an alternative embodiment of an exemplary portion of phase-shifting variable-delay delay line 110 of FIG. 1.

In certain alternative embodiments, the variable-delay stages 202 (FIG. 3) of the phase-shifting variable-delay delay line 110 may rely on gate delays as illustrated in FIG. 3, without a switchable capacitive load. In the variable-delay delay-line stage 202 of FIG. 3, a multiplexor formed of transistors 204, 206, 208, 210 and inverter 212 selects an input to output inverter 214 from a signal that has been delayed by an even number of inverters 216, 218, or an undelayed signal 220. Stage 202 may be inverting, in which case undelayed signal 220 is input to the stage, or may be noninverting with a buffer inverter 222.

An alternative embodiment 250 (FIG. 4), which requires some care in design so that change of delay triggered by the random sequence generator 252 does not cause clock glitches, substitutes a multiplexor 254 and a non-variable, but multiply-tapped, multi-inverter delay line 256 in variable phase shifter 258 of the frequency-spreading system 259.

Output 221 from multiplexor 254 may be buffered by a clock driver and used as digital clocks to portions of the system (including random sequence generator 252), in some embodiments be divided by an optional clock divider 260 to produce multiple clock phases or lower frequency clocks 261 to drive other portions of the system.

Figure 4:
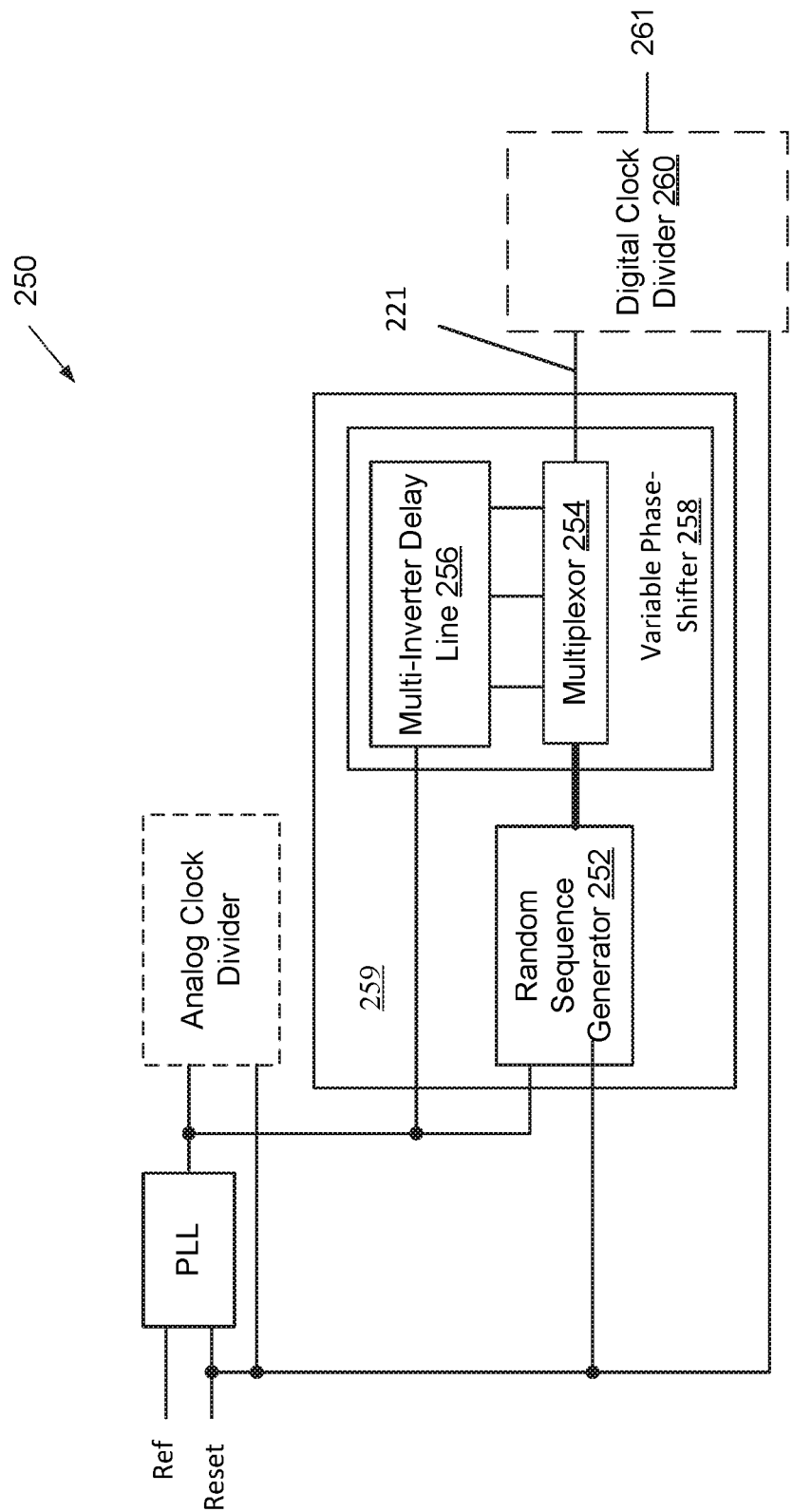
FIG. 4 illustrates an alternative embodiment of the clock generator using a delay line and multiplexor as a variable phase delay.
Figure 5:
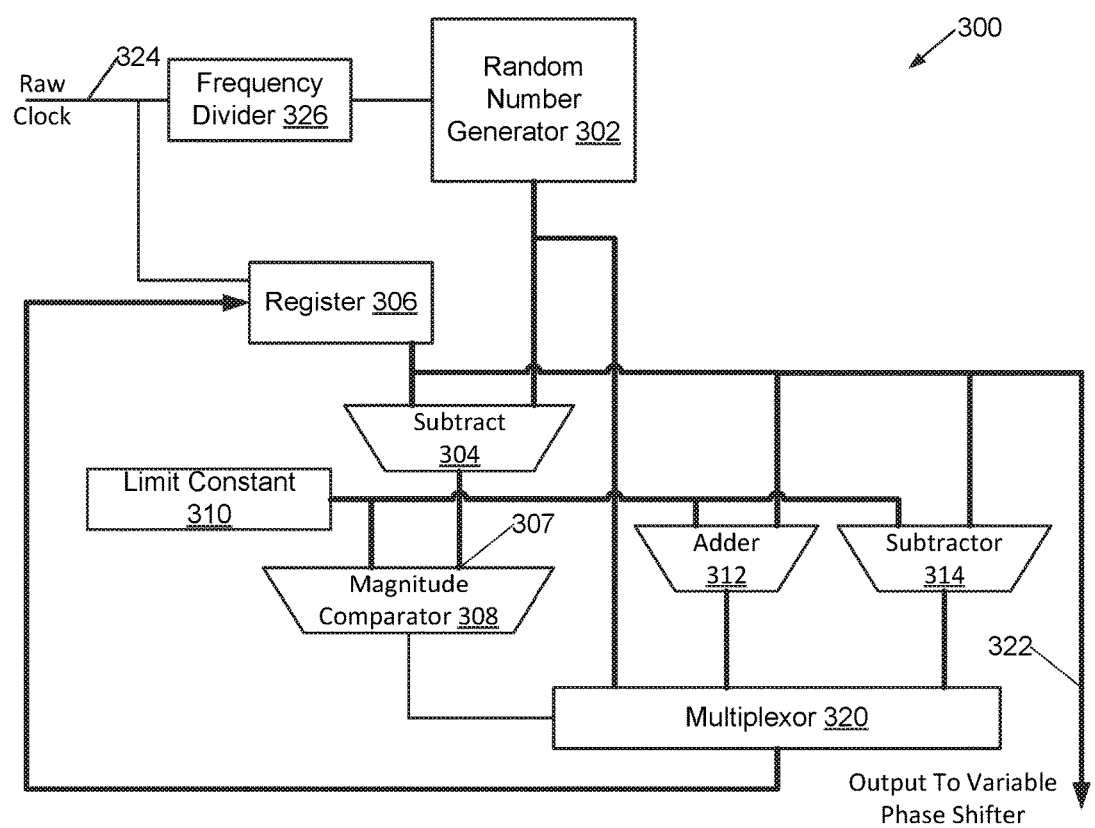
FIG. 5 illustrates a block diagram of a random sequence generator for use in the embodiments of FIGS. 1 and 4.
Figure 6:
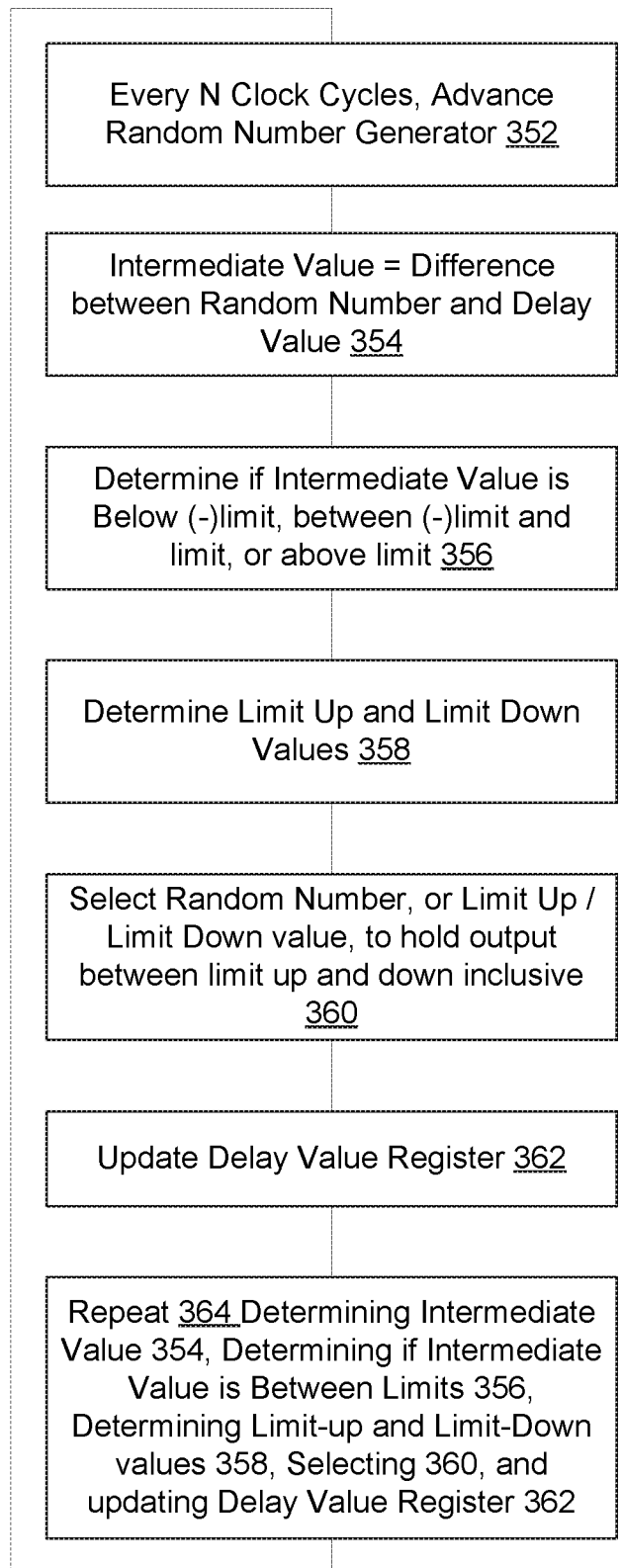
FIG. 6 is a flowchart of operation of the random sequence generator of FIG. 5.

In some embodiments, which may include the embodiments of FIGS. 1 and 4, the random sequence generator 300, 252 and 116 (from FIGS. 5, 4 and 1 respectively) has structure and operation as illustrated in FIGS. 5 and 6. A random number generator 302 generates 352 a pseudorandom number, this random number generator is advanced to a new value every N clock cycles, the random number with a predetermined range representing a range of permissible phase offsets. In most embodiments, N is a known fixed integer number greater than or equal to one, in a particular embodiment N is two. A subtractor 304 compares 354 the random number to a prior random sequence generator 116 and 252 (from FIGS. 4 and 1 respectively) output as held in a register 306 to determine an intermediate value 307 corresponding to how far the random number has moved from the prior sequence generator output, and in which direction. A magnitude comparator 308 compares the intermediate value to a phase-change limit constant 310 to determine 356 if the intermediate value is below minus the phase-change limit constant 310, between minus the phase-change limit constant 310 and the phase-change limit constant 310, or above phase-change limit constant 310, simultaneously a limit-up value and a limit-down value are determined 358 by adding (in adder 312) and subtracting (in subtractor 314) phase-change limit constant 310 to the prior sequence generator output in register 306. Next, a multiplexor 320 selects 360 from the limit up value, the limit down value, or the random number, according to magnitude comparator 308 results, to provide a change-limited value in the range from the limit-down value to the limit-up value to register 306, where it becomes 362 random sequence generator 252 and 116 (from FIGS. 4 and 1 respectively), output as register 306 updates at the next clock. In an embodiment, the multiplexor is configured to select the limit down value if the random number generator output is smaller than or equal to the prior sequence generator output minus the limit constant, the multiplexor 320 is configured to select the limit up value if the random number generator output is greater than or equal to the prior sequence generator output plus the limit constant, and the random number generator output in all other conditions. This output is latched in the register 306. To ensure the sequence generator provides glitch-free, clocked-synchronized, change-limited output 322 to the variable phase-shifter 112 and 258 (from FIGS. 1 and 4 respectively), output 322 is taken from register 306.

In some embodiments, including those where the random number generator 302 is not updated every clock cycle, we permit a phase change of up to the limit indicated by the phase-change limit constant 310 in the first clock cycle after each update of random number generator 302, with any remaining phase change indicated by the random number implemented in one or more subsequent clock cycles. This can be done by determining a residue, or remaining phase change, limiting the residue, and applying the residue in one or more intermediate subsequent clock cycles. This can also be done simply, by updating register 306 again in intermediate subsequent clock cycles, which has the effect of repeating 364 the steps of determining 354 intermediate value, determining 356 if intermediate value is between plus and minus the limit, determining limit-up and limit-down values 358, selecting 360 the limit-down value, the random number, or the limit-up value, and updating 362 delay value register. After intermediate subsequent clock cycles where residue is applied, a later subsequent clock cycle updates random number generator 302 output and limited phase changes are applied. In the embodiment of FIG. 5, this is implemented by providing a frequency divider 326 that divides a raw clock 324 and uses divided clock to update random number generator 302, while updating register 306 each cycle. In alternative embodiments, other fixed division ratios may be used, in one such embodiment, random number generator 302 updates every six cycles of raw clock 324, and register 306 updates every two cycles, with three updates of register 306 for each update of random number generator 302; in this embodiment, after random number generator 302 updates, register 306 is updated three successive times with a delay value that does not change by more than the limit constant 310 in each update. In an alternative embodiment, we permit a phase change of up to the limit indicated by the phase-change limit constant 310 in the first clock cycle after each update of random number generator 302, with any remaining phase change indicated by the random number implemented in one or more subsequent clock cycles, until all phase change indicated by the random number is implemented, whereupon the random number is updated in a following clock cycle; this has the effect of somewhat randomizing updates of the random number generator and varying N, the division ratio between clock and the random number generator.

In another alternative embodiment, particularly useful for systems with low clock-jitter tolerance, limit constant 310 is set to one, limiting changes to phase shifter 322 to be one step at a time, a minimum phase shift at each cycle. To implement this, random number generator 302 will holds output until register 306, which decreases or increases its value one step at a time, reaches that number. Then random number generator 302 will advance its output. In this particular embodiment, the update period (N) of random number generator 352 depends on the random number it generated. In a particular embodiment of this minimum-phase-shift embodiment, register 306 is implemented with a parallel-loadable up-down counter with the adder 312 and subtractor 314 replaced by the increment and decrement carry chain of the counter.

Figure 7:
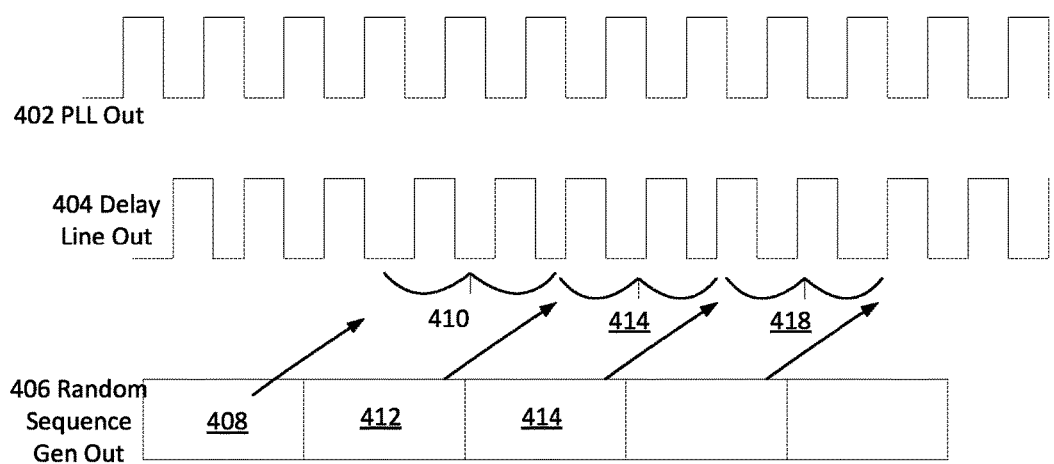
FIG. 7 is a waveform diagram illustrating waveforms of the clock generator of FIG. 1.

Operation of the spread-spectrum clock generator is illustrated in FIG. 7, with reference to FIGS. 1 and 4. Phase-locked loop output 106 is a stable-frequency waveform, in a particular embodiment a square wave 402. Variable phase shifter 258, 112, output 404, corresponding to the delay line output or multiplexor output, betrays some unsteadiness or phase jitter as changes to the random sequence generator output 406 propagate to variable phase shifter output 404.

For example, when random sequence generator output 406 transitions from a first value 408 to a second value 412 and this transition propagates to phase shifter output 404, a phase shift from a first phase 410 to a second phase 414 can be seen. Similarly when random sequence generator output 406 transitions from second value 412 to a third value 416 and this transition propagates to phase shifter output 404, a phase shift from second phase 414 to a third phase 418 is seen.

With reference to FIGS. 1, 4 and 5, the spread clock spectrum produced by a system incorporating embodiments depends on the unitary increment of phase shift available at the variable phase shifter 112, 258, the maximum phase change limit constant 310, the range of random numbers generated by random number generator 302, whether N is fixed or variable, and if fixed the value of N, and the fundamental frequency of phase locked loop output 106, as well as other factors. In some particular embodiments, one or more of these factors is configurable within a range at run time, and in other embodiments one or more of these factors is determined by design.

Combinations

A spread-spectrum clock generator system according to the principles described herein may be assembled with a variety of combinations of components. For example, the system may use either (the delay line of FIG. 2, of FIG. 3, or another configurable-delay delay line in an embodiment resembling FIG. 1), or the delay-line and multiplexor of FIG. 4, with the computational circuitry of FIG. 5. In alternative embodiments, the limit computations discussed with reference to FIG. 5 are performed in alternative ways; we note that these computations can be performed in two's complement signed arithmetic, or in other number systems. Specific combinations anticipated include:

A spread-spectrum clock generator designated A including a phase-locked loop adapted to lock to a reference signal and providing a stable-frequency output to a variable phase shifter, the variable phase shifter providing a spread-spectrum clock output; and a pseudorandom sequence generator having an output configured to control phase shift of the variable phase shifter, the pseudorandom sequence generator configured to change its output.

A spread spectrum clock generator designated AA including the spread spectrum clock generator designated A wherein the pseudorandom sequence generator further includes a random number generator having an output, circuitry adapted to determine a difference between the random number generator output and a prior output of the pseudorandom sequence generator, circuitry adapted to determine if the difference between the random number generator output and the prior output of the pseudorandom sequence generator exceeds a limit, and circuitry for selecting as the pseudorandom sequence generator output one of the output of the random number generator, a limit-up value, and a limit-down value.

A spread spectrum clock generator designated AB including the spread spectrum clock generator designated A or AA further comprising an analog clock generator coupled directly to the stable frequency output of the phase-locked loop.

A spread spectrum clock generator designated AC including the spread spectrum clock generator designated A, AA, or AB wherein the variable phase shifter comprises a variable-delay delay line.

A spread spectrum clock generator designated AD including the spread spectrum clock generator designated AC wherein the variable-delay delay line comprises a plurality of stages where at least some stages comprise at least one load capacitor coupled through a selectable transmission gate.

A spread spectrum clock generator designated AE including the spread spectrum clock generator designated AC wherein the variable-delay delay line comprises a plurality of stages where at least some stages comprise a multiplexor configured to select between a more-delayed and a less-delayed signal.

A spread spectrum clock generator designated AF including the spread spectrum clock generator designated AC wherein the variable-delay delay line includes a plurality of delay stages coupled in series, and a multiplexor configured to select an output of the plurality of delay stages as the variable-delay delay line's output.

A spread spectrum clock generator designated AG including the spread spectrum clock generator designated A, AA, AB, AC, AD, AE, or AF further comprising an analog clock divider coupled to receive the phase locked loop output directly, the spread-spectrum clock output being configured to drive a digital clock driver.

A method of generating a spread-spectrum clock designated B including locking a phase-locked loop to a reference signal, the phase locked loop providing a stable frequency signal; phase shifting the stable frequency signal by a phase-shift determined by a pseudorandom sequence generator; and changing the phase-shift determined by the pseudorandom sequence generator.

A method of generating a spread spectrum clock designated BA including the method designated B wherein the phase-shift determined by a pseudorandom sequence generator is a phase-shift selected between a random number, a limit-up phase shift determined from a prior output of the pseudorandom sequence generator, and a limit-down phase shift determined from the prior output of the pseudorandom sequence generator.

A method of generating a spread spectrum clock designated BB including the method designated B or BA wherein the phase shift is performed by a variable-delay delay line.

A method of generating a spread spectrum clock designated BC including the method designated BB wherein the variable-delay delay line comprises a plurality of stages where at least some stages comprise at least one load capacitor coupled through a selectable transmission gate.

A method of generating a spread spectrum clock designated BD including the method designated BB wherein the variable-delay delay line comprises a plurality of stages where at least some stages comprise a multiplexor configured to select between a more-delayed and a less-delayed signal.

CONCLUSION

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A spread-spectrum clock generator comprising:
   a phase-locked loop adapted to lock to a reference signal and providing a stable-frequency output to a variable phase shifter, the variable phase shifter providing a spread-spectrum clock output; and a pseudorandom sequence generator having an output configured to control phase shift of the variable phase shifter, the pseudorandom sequence generator configured to change its output;

wherein the pseudorandom sequence generator further comprises:

a random number generator having an output, circuitry adapted to determine a difference between the random number generator output and a prior output of the pseudorandom sequence generator, circuitry adapted to determine if the difference between the random number generator output and the prior output of the pseudorandom sequence generator exceeds a limit, and circuitry for selecting as the pseudorandom sequence generator output one of the output of the random number generator, a limit-up value, and a limit-down value.

2. The spread-spectrum clock generator of claim 1 further comprising:
an analog clock generator coupled directly to the stable frequency output of the phase-locked loop.

3. The spread spectrum clock generator of claim 1 wherein the variable phase shifter comprises a variable-delay delay line.

4. The spread spectrum clock generator of claim 3 wherein the variable-delay delay line comprises a plurality of stages where at least some stages comprise at least one load capacitor coupled through a selectable transmission gate.

5. The spread spectrum clock generator of claim 3 wherein the variable-delay delay line comprises a plurality of stages where at least some stages comprise a multiplexor configured to select between a more-delayed and a less-delayed signal.

6. The spread spectrum clock generator of claim 1 wherein the variable-delay delay line comprises a plurality of delay stages coupled in series, and a multiplexor configured to select an output of the plurality of delay stages as the variable-delay delay line's output.

7. The spread spectrum clock generator of claim 1 further comprising an analog clock divider coupled to receive the phase locked loop output directly.

8. A method of generating a spread-spectrum clock comprising:
locking a phase-locked loop to a reference signal, the phase locked loop providing a stable frequency signal;
phase shifting the stable frequency signal by a phase-shift determined by a pseudorandom sequence generator;
determining a limit-down phase shift and a limit-up phase shift from a prior output of the pseudorandom sequence generator; and
changing the phase-shift determined by the pseudorandom sequence generator;
wherein the phase-shift determined by a pseudorandom sequence generator is a phase-shift selected according to a difference between a pseudorandom number and the prior output of the pseudorandom sequence generator from the pseudorandom number, the limit-up phase shift, and the limit-down phase shift; and
wherein the phase shift is performed by a variable-delay delay line.

9. The method of claim 8 wherein the variable-delay delay line comprises a plurality of stages where at least some stages comprise at least one load capacitor coupled through a selectable transmission gate.

10. The method of claim 8 wherein the variable-delay delay line comprises a plurality of stages where at least some stages comprise a multiplexor configured to select between a more-delayed and a less-delayed signal.

11. A spread-spectrum clock generator comprising:
a phase-locked loop adapted to lock to a reference signal and providing a stable-frequency output to a variable phase shifter, the variable phase shifter providing a spread-spectrum clock output; and
a pseudorandom sequence generator having an output configured to control phase shift of the variable phase shifter, the pseudorandom sequence generator configured to change its output; and an analog clock generator coupled directly to the stable frequency output of the phase-locked loop.

12. The spread spectrum clock generator of claim 11 wherein the variable phase shifter comprises a variable-delay delay line.

13. The spread spectrum clock generator of claim 12 wherein the variable-delay delay line comprises a plurality of stages where at least some stages comprise at least one load capacitor coupled through a selectable transmission gate.

14. The spread spectrum clock generator of claim 12 wherein the variable-delay delay line comprises a plurality of stages where at least some stages comprise a multiplexor configured to select between a more-delayed and a less-delayed signal.

15. The spread spectrum clock generator of claim 12 wherein the variable-delay delay line comprises a plurality of delay stages coupled in series, and a multiplexor configured to select an output of the plurality of delay stages as the variable-delay delay line's output.

* * * * *